(12) United States Patent
Qiu et al.

(10) Patent No.: US 8,920,767 B2
(45) Date of Patent: Dec. 30, 2014

(54) ARRAY OF TITANIUM DIOXIDE NANOSTRUCTURES FOR SOLAR ENERGY UTILIZATION

(75) Inventors: Xiaofeng Qiu, Sleepy Hollow, NY (US); Mariappan Parans Paranthaman, Knoxville, TN (US); Miaofang Chi, Knoxville, TN (US); Ilia N. Ivanov, Knoxville, TN (US); Zhenyu Zhang, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 803 days.

(21) Appl. No.: 13/213,923

(22) Filed: Aug. 19, 2011

(65) Prior Publication Data

US 2013/0045383 A1 Feb. 21, 2013

(51) Int. Cl.
*C01G 23/047* (2006.01)
*H01L 31/0352* (2006.01)
*H01B 1/08* (2006.01)
*H01L 31/18* (2006.01)

(52) U.S. Cl.
CPC .......... *H01B 1/08* (2013.01); *H01L 31/035281* (2013.01); *H01L 31/18* (2013.01); *Y02E 10/50* (2013.01); *H01L 31/035218* (2013.01)
USPC ....................................................... 423/610

(58) Field of Classification Search
None
See application file for complete search history.

(56) References Cited

U.S. PATENT DOCUMENTS

2007/0137697 A1  6/2007  Kempa et al. ................. 136/256
2007/0184975 A1  8/2007  Yi et al. ......................... 502/343
2010/0044630 A1  2/2010  Kang et al. ................. 252/182.33
2010/0078066 A1  4/2010  Darling et al. ................. 136/256
2010/0304204 A1  12/2010  Routkevitch et al. ......... 429/122

FOREIGN PATENT DOCUMENTS

| CN | 2597903 Y | 1/2004 | ................. F24J 2/00 |
| CN | 101260557 A | 9/2008 | ............. C25D 11/26 |
| CN | 101347725 A | 1/2009 | ............... B01J 23/42 |
| CN | 101538713 A | 9/2009 | ............... C23C 28/02 |
| CN | 101601994 A | 12/2009 | ............... B01J 23/10 |
| KR | 1020100002443 A | 1/2010 | ............ H01L 31/042 |
| WO | WO2010/079516 A1 | 7/2010 | ........... C01G 23/047 |

OTHER PUBLICATIONS

Chen, Huan et al., "*Fabrication of $TiO_2$-Pt Coaxial Nanotube Array Schottky Structures for Enhanced Photocatalytic Degradation of Phenol in Aqueous Solution*," J. Phys. Chem C, 112 (25) (2008) pp. 9285-9290, (Abstract Only—1 page).
Chen, Y et al., "*Preparation of a Novel TiO2-Based p-n Junction Nanotube Photocatalyst*," Environ Sci Technol, 39 (5) (2005) pp. 1201-1208, (Abstract Only—1 page).
Grätzel, Michael, "*Dye-Sensitized Solar Cells*," Journal of Photochemistry and Photobiology C: Photochemistry Reviews, 4 (2003) pp. 145-153.

(Continued)

*Primary Examiner* — Melvin C Mayes
*Assistant Examiner* — Stefanie Cohen
(74) *Attorney, Agent, or Firm* — Brinks Gilson & Lione

(57) ABSTRACT

An array of titanium dioxide nanostructures for solar energy utilization includes a plurality of nanotubes, each nanotube including an outer layer coaxial with an inner layer, where the inner layer comprises p-type titanium dioxide and the outer layer comprises n-type titanium dioxide. An interface between the inner layer and the outer layer defines a p-n junction.

23 Claims, 9 Drawing Sheets

- Diameter of the nanotubes
- Preferred N-doping sites
- Thickness of *p*- and *n*- layers
- Distribution of N across the *p-n* junction N atom at outer wall site:
E=-1530.1974 eV N atom at inner wall site (lower E site):
E = -1530.4281 eV

(56) References Cited

OTHER PUBLICATIONS

Kim, Doohun et al., "*Bamboo-Type $TiO_2$ Nanotubes: Improved Conversion Efficiency in Dye-Sensitized Solar Cells*," J. Am. Chem. Soc., 130 (49) (2008) pp. 16454-16455, (Abstract Only—1 page).

Pagliaro, Mario et al., "*Working Principles of Dye-Sensitised Solar Cells and Future Applications*," Photovoltaics International Journal—Third print edition (2009) pp. 1-4.

Shankar, Karthik et al., "*Highly Efficient Solar Cells Using $TiO_2$ Nanotube Arrays Sensitized with a Donor-Antenna Dye*," Nano Lett., 8 (6) (2008) pp. 1654-1659, (Abstract Only—1 page).

Tian, Bozhi et al., *Coaxial Silicon Nanowires as Solar Cells and Nanoelectronic Power Sources*, Nature 449 (2007) pp. 885-889, (Abstract Only—2 pages).

Vitiello R.P. et al., *N-Doping of Anodic $TiO_2$ Nanotubes Using Heat Treatment in Ammonia*, Electrochemistry Communications 8 (2006) pp. 544-548.

Zhou, Hang et al., *Arrays of Parallel Connected Multiwall-Carbon-Nanotube-Amorphous-Silicon Solar Cells*, Advanced Materials 21 38-39 (2009) pp. 3919-3923, (Abstract Only—1 page).

Zhu, Wen et al., "*Coaxial Heterogeneous Structure of $TiO_2$ Nanotube Arrays with CdS as a Superthin Coating Synthesized via Modified Electrochemical Atomic Layer Deposition*," J. Am. Chem. Soc. 132 (36) (2010) pp. 12619-12626, (Abstract Only—1 page).

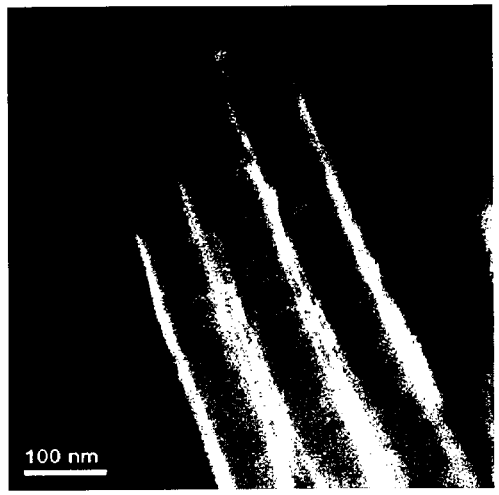 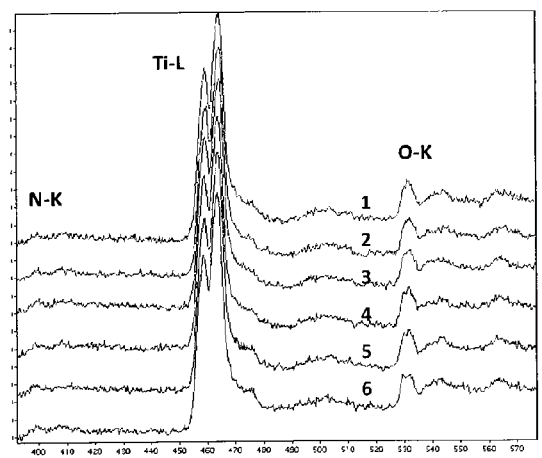
Figure 7(a)          Figure 7(b)
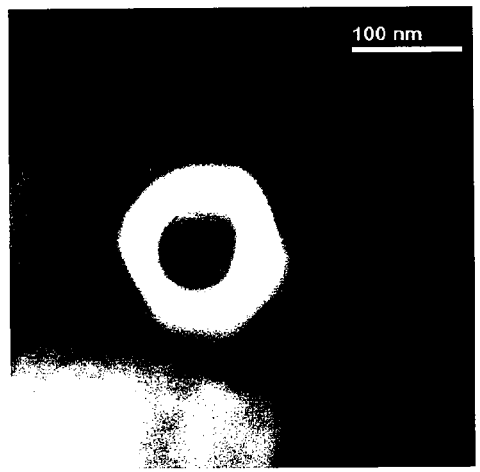 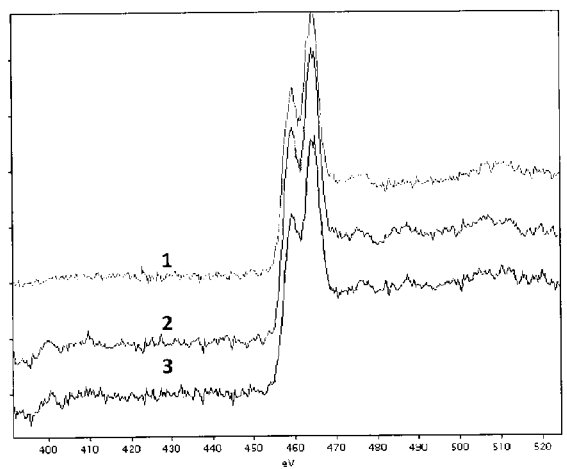
Figure 8(a)          Figure 8(b)

Figure 9(a)
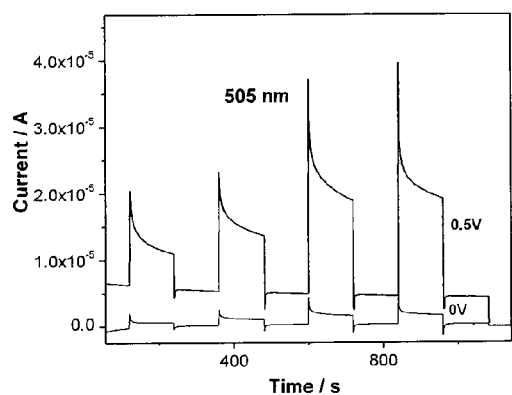
Figure 9(b)
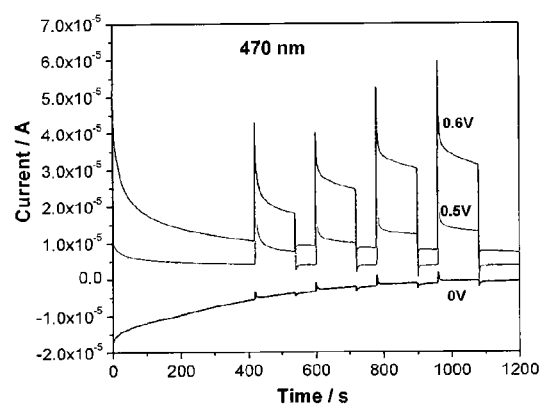
Figure 9(c)
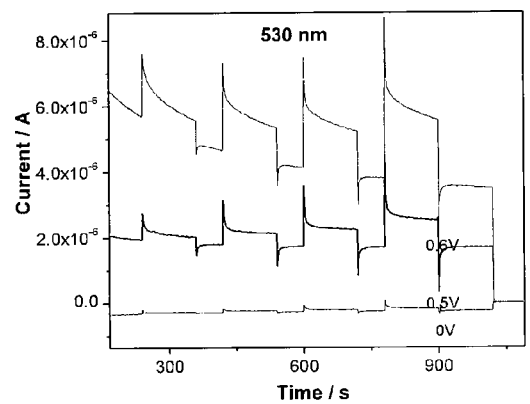
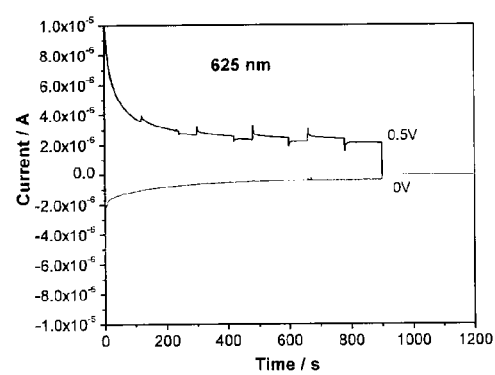
Figure 9(d)

470 nm excitation 470 nm photocurrent vs light power

L>1/α (optical thickness)

Ln: minority electron diffusion length

- Diameter of the nanotubes
- Preferred N-doping sites
- Thickness of $p$- and $n$- layers
- Distribution of N across the $p$-$n$ junction N atom at outer wall site:
E= -1530.1974 eV N atom at inner wall site (lower E site):
E = -1530.4281 eV ic fields, and al solar energy utilization based on the coaxial structure, as well as an array of the nanostructures and a method of making such nanostructures.

ARRAY OF TITANIUM DIOXIDE NANOSTRUCTURES FOR SOLAR ENERGY UTILIZATION

FEDERALLY SPONSORED RESEARCH OR DEVELOPMENT

This invention was made with government support under Contract No. DE AC05-00OR22725 awarded by the U.S. Department of Energy. The government has certain rights in the invention.

TECHNICAL FIELD

The present disclosure is related generally to materials for solar energy utilization and more particularly to arrays of titanium dioxide nanostructures.

BACKGROUND

In recent years, the activity in solar cell research has considerably increased due to the need for solar-to-electricity and solar-to-fuel conversion with increased efficiency. $TiO_2$ is widely recognized as one of the most promising photocatalysts for solar energy utilization, but its energy conversion efficiency has been severely limited by its intrinsic band gap of 3.2 eV, which can be excited only by ultraviolet light (small fraction of the sunlight). Researchers have employed various strategies to make $TiO_2$ more responsive to visible light, including incorporating a dye or sensitizer on $TiO_2$ particles or films and also doping $TiO_2$.

Dye-sensitized solar cells (Gratzel cells) based on $TiO_2$ have emerged as a viable technology for photovoltaics, which have traditionally relied on solid-state junction devices based on silicon. These hybrid organic-inorganic devices separate the two tasks of light absorption and charge carrier transport. An organic sensitizer or dye attached to the surface of a wide band gap semiconductor (e.g., $TiO_2$) absorbs light, and charge separation occurs at the interface by photo-induced electron injection from the dye into the conduction band of the semiconductor. Charge carriers move from the conduction band to the charge collector, and conversion of incident photons into electric current may be achieved over a large spectral range extending from the ultraviolet to the near infrared region. The use of dyes having a broad absorption band in conjunction with high surface area $TiO_2$ films allows a large fraction of sunlight to be harvested. Values exceeding 11% efficiency using mesoporous anatase $TiO_2$ at one sun illumination were achieved by Gratzel in 2006.

A downside of dye-sensitized solar cell technology, however, is that the dye must be regenerated with electrons, and the typical approach involves using a redox electrolyte that includes corrosive media in an organic solvent. Over time, the electrodes may become corroded as a consequence of the regeneration process and may degrade, thereby diminishing the performance of the solar cell. Accordingly, improved technologies are needed to avoid long-term stability problems as well as sealing issues with dye-sensitized $TiO_2$ cells.

BRIEF SUMMARY

The inventors have developed a controlled doping process to form $TiO_2$ nanotubes that include p-type and n-type $TiO_2$ layers in a coaxial arrangement, where the interface between the $TiO_2$ layers defines a p-n junction. An array of such nanotubes can potentially form the basis of a next-generation solar cell. Described herein is a $TiO_2$ nanostructure for solar energy utilization based on the coaxial structure, as well as an array of the nanostructures and a method of making such nanostructures.

A titanium dioxide nanostructure for solar energy utilization includes a nanotube comprising an outer layer coaxial with an inner layer, where the inner layer includes p-type titanium dioxide and the outer layer includes n-type titanium dioxide. An interface between the inner layer and the outer layer defines a p-n junction.

An array of titanium dioxide nanostructures for solar energy utilization includes a plurality of nanotubes, each nanotube including an outer layer coaxial with an inner layer, where the inner layer comprises p-type titanium dioxide and the outer layer comprises n-type titanium dioxide. An interface between the inner layer and the outer layer defines a p-n junction.

A method of making an array of titanium dioxide nanostructures for solar energy utilization includes creating an array of nanotubes comprising titanium dioxide; exposing the array of nanotubes to a gas comprising a dopant element; and controllably doping the nanotubes to form an inner layer of each nanotube comprising p-type titanium dioxide and an outer layer coaxial with the inner layer that comprises n-type titanium dioxide, where an interface between the inner layer and the outer layer defines a p-n junction.

BRIEF DESCRIPTION OF THE DRAWINGS

FIGS. 7(a)-7(b) show a transmission electron microscopy (TEM) image and corresponding electron energy loss spectroscopy (EELS) spectrum for an exemplary N-doped $TiO_2$ nanotube;

FIGS. 8(a)-8(b) show a cross-sectional TEM image and corresponding EELS spectrum for an exemplary N-doped $TiO_2$ nanotube;

FIGS. 9(a)-9(d) show photocurrent data obtained from exemplary N-doped coaxial $TiO_2$ nanotube arrays under visible light irradiation;

DETAILED DESCRIPTION

Higher efficiency of conversion of light to electricity can be achieved in multi-junction photovoltaic cells, which are applicable for thin film and organic cells. The concept takes advantage of several light absorbing materials with different band gaps, combining them in a sandwich configuration such that each layer absorbs part of the solar spectrum. Theoretical limits of tandem cells including two layers of active material could reach 55%. This multi-junction approach allows avoiding a problem of lattice matching requirements for different layers. It also increases the theoretical limit of light to electricity conversion efficiency from 42% for tandem cells to 68% for infinity-layer cells.

In the present disclosure, a controlled doping process is used to create a novel array of titanium dioxide ($TiO_2$) nanotubes, where each nanotube has a coaxial structure of p-type and n-type titanium dioxide that defines a p-n junction, in order to enhance the photo-generated charge separation for solar energy applications. The engineered titanium dioxide nanotubes may be referred to as coaxial p-n junction nanotubes.

Figure 1:
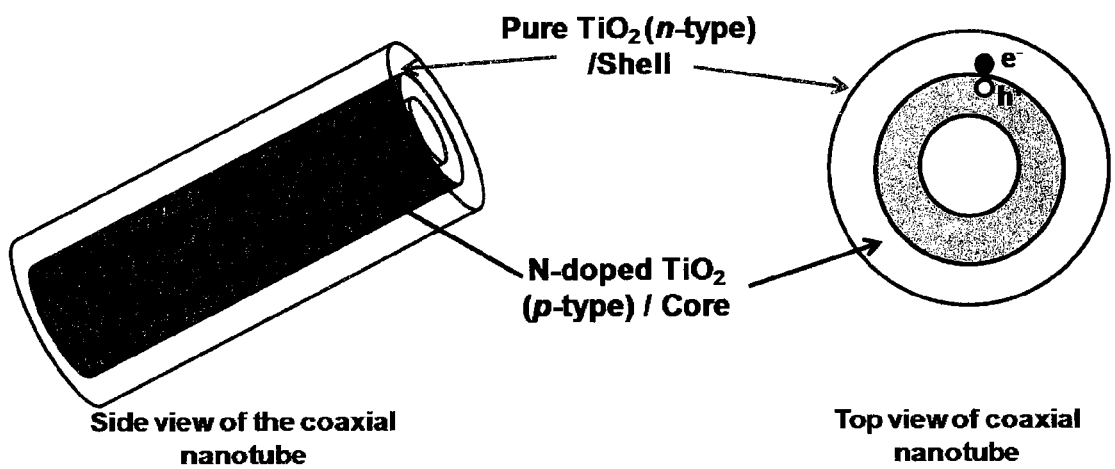
FIG. 1 is a schematic illustration of an exemplary coaxial $TiO_2$ nanotube design.

Referring to FIG. 1, an exemplary coaxial p-n junction nanotube includes coaxial inner and outer layers, where the inner layer comprises p-type titanium dioxide and the outer layer comprises n-type titanium dioxide. The interface between the inner layer and the outer layer defines the p-n junction. Typically, the inner layer includes nitrogen-doped titanium dioxide, and the outer layer includes undoped titanium dioxide. It is also contemplated that the inner layer may be doped with an element (dopant) other than nitrogen, such as carbon, fluorine, phosphorus and/or sulfur.

The dopant may be present in an amount that varies along a radial direction. For example, the amount of nitrogen (or other dopant) may decrease with distance from the center of the nanotube, where a larger amount of nitrogen is present at an innermost surface of the inner layer and a lesser amount of nitrogen is present at the interface between the inner layer and the outer layer. It is also possible that the dopant may be present in an amount that is substantially uniform along the radial direction over some or all of the thickness of the inner layer. The doping profile may be controlled by the process conditions. Typically, the inner layer has a thickness of between about 5 nm and about 40 nm. The outer layer may have a thickness of between about 5 nm and 40 nm, and the nanotube structure may have an inner diameter of between about 10 nm and 80 nm.

The dopant may be present in substitutional and/or interstitial sites of the titanium dioxide lattice. As discussed further below in reference to x-ray photoelectron spectroscopy (XPS) data, a majority of the dopant (e.g., nitrogen) may be present in the substitutional sites.

An array including a plurality of the coaxial p-n junction nanotubes may be fabricated, where each nanotube of the array includes coaxial inner and outer layers as described above. In particular, the inner layer comprises p-type titanium dioxide, the outer layer comprises n-type titanium dioxide, and the interface between the inner layer and the outer layer defines a p-n junction. The array of titanium dioxide nanotubes advantageously exhibits a light absorption of both ultraviolet and visible light regions.

The radial p-n junction configuration (co-axial junction concept) is based on decoupling the direction of incident light and the proximity of generated charge carriers to the p-n junction. The merit of such a cell lies in the fact that the vertical alignment of many cylindrical junctions together may enable photon-generated minority carriers to have a higher probability of reaching a junction, thus increasing carrier collection efficiency as well as the tolerance to radiation damage, defects, and impurities.

A method of making the array entails, in summary, creating an array of nanotubes comprising titanium dioxide, and then exposing the array of $TiO_2$ nanotubes to a gas comprising a dopant element (e.g., nitrogen). The nanotubes are controllably doped, and an inner layer comprising p-type titanium dioxide is formed for each nanotube along with a coaxial outer layer that comprises n-type titanium dioxide. An interface between the inner layer and the outer layer defines a p-n junction.

The array of titanium dioxide nanotubes may be created by anodizing a titanium foil, where the anodizing is carried out at a voltage between 10 V and 100 V, and the voltage may also be between about 40 V and 60 V. Nanotubes of larger inner diameters result from anodization at higher voltages. The anodizing may be carried out at an anodizing temperature of between about −20° C. and about 20° C., where lower anodization temperatures may result in nanotubes having smaller inner diameters. An exemplary anodization process is described in the example below.

Once synthesized, the array of titanium dioxide nanotubes is exposed to a gas comprising a dopant element (e.g., N, C, F, P, or S) in order to controllably dope the nanotubes. The exposure may entail flowing a gas containing the desired dopant element through the array at a flow rate of between about few milliliters/hour and several liters/hour, and the array may be heated at an annealing temperature of about 500° C. during the exposure to the gas. The annealing temperature may lie between about 100° C. and 700° C., for example, or between about 300° C. and about 600° C. When the dopant element is nitrogen, the gas flowed through the array may be ammonia ($NH_3$).

Figure 2A:
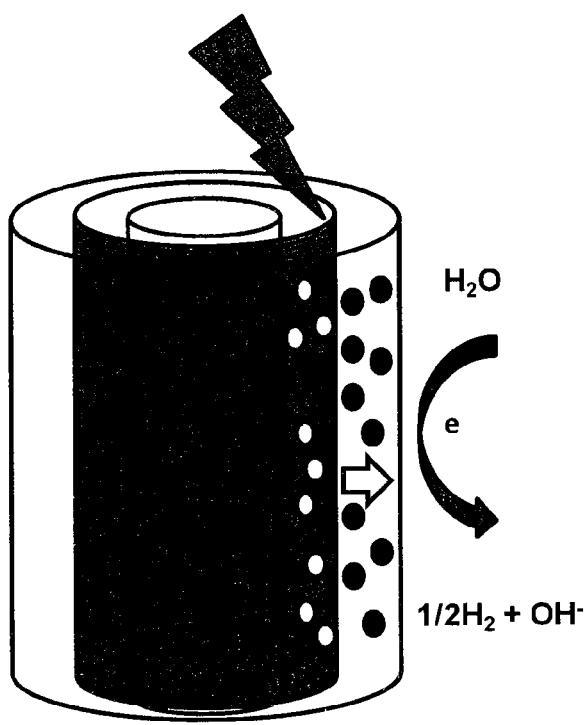
FIGS. 2(a) and 2(b) are schematic illustrations of an exemplary coaxial $TiO_2$ nanotube employed in a (a) photocatalytic process and (b) photovoltaic process.
Figure 2B:
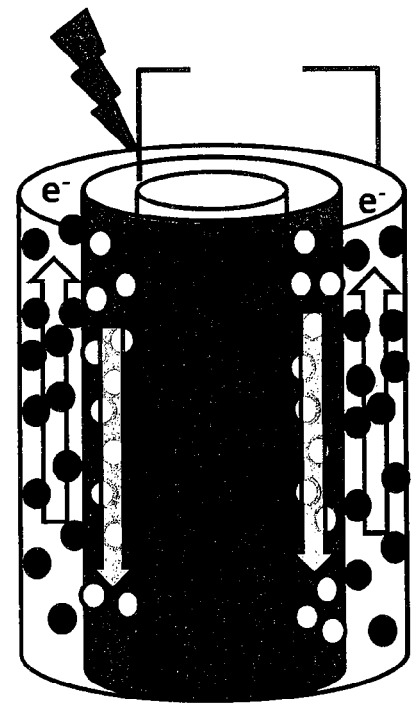
Figure 3A:
FIGS. 3(a)-3(d) are schematics illustrating steps of an exemplary process to synthesize coaxial p-n junction $TiO_2$ nanotube arrays.
Figure 3B:
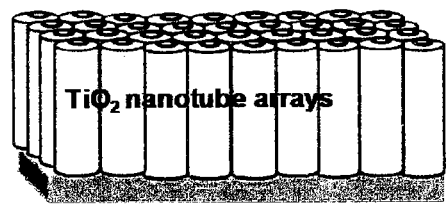
Figure 3C:
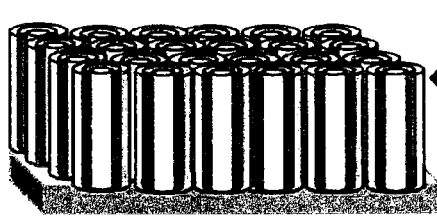
Figure 3D:
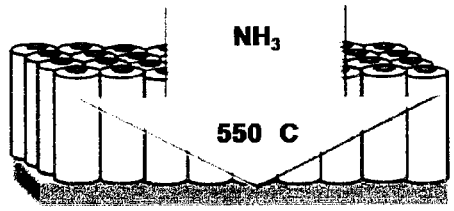

Titanium dioxide nanotubes having the coaxial structure set forth in the present disclosure can be used for converting solar energy into chemical energy (photocatalytic process) and also solar energy into electricity (photovoltaic process), as shown schematically in FIGS. 2(a) and 2(b), respectively. Advantages of the nanotubes are summarized below:

(1) For photovoltaics: low cost, lower material requirements, excellent chemical and mechanical stability, better light absorption, electrochemical synthesis method applicable for large-scale production (2) For photoelectrochemistry: internal p-n junction, high collection efficiency, large surface and better light absorption, low cost, excellent chemical and mechanical stability.

EXAMPLE

Synthesis, Characterization, and Photoelectrochemical Properties of $TiO_2$ Nanotube Arrays Exemplary $TiO_2$ nanotube arrays can be synthesized by anodizing titanium foil (0.127 mm thick, 99.5%, Alfa Aesar) using a Keithley 2612 system (Keithley Instrument Inc.) in an electrolyte solution containing 0.2 M $NH_4F$ (99%, J T Baker Inc.) in ethylene glycol (99+%, Alfa Aesar). The anodization is carried out at room temperature for 1 hour. Prior to anodization, the Ti foils are cleaned using distilled water, ethanol and acetone in an ultrasound bath. The nanotube structures are grown in the voltage range between 10 and 100 V. After anodization, the prepared $TiO_2$ nanotube arrays can be annealed at 550° C. under a flow of $NH_3$ for 1 h to achieve nitrogen incorporation. A flow-chart of the synthesis of coaxial p-n junction $TiO_2$ nanotube arrays according to this example is shown in FIGS. 3(a)-3(d).

Figure 4:
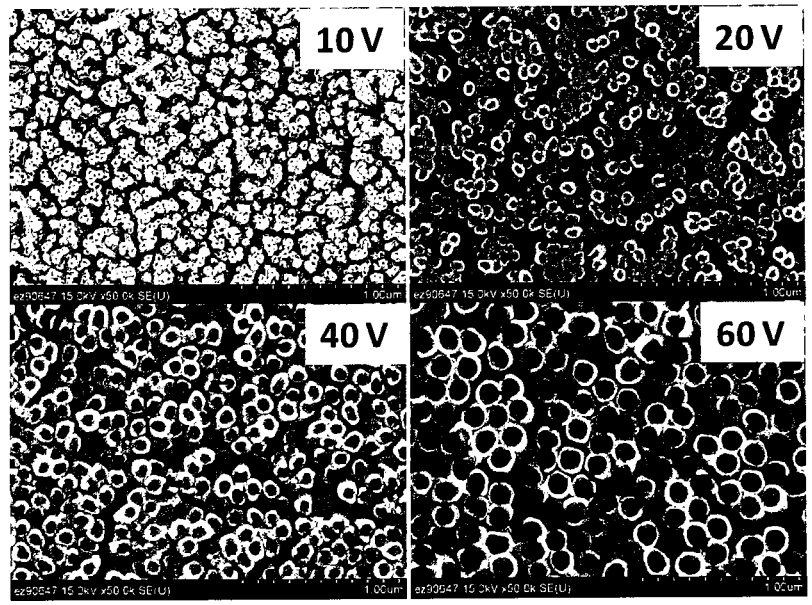
FIG. 4 shows scanning electron microscopy (SEM) images of exemplary N-doped $TiO_2$ coaxial nanotube arrays.

Referring to FIG. 4, scanning electron microscopy (SEM) images of exemplary N-doped $TiO_2$ coaxial nanotube arrays show that the array morphologies are maintained after $NH_3$ thermal annealing. In addition, the images show that the pore size (inner diameter) of the nanotubes is dependent on the applied voltage during anodization (as shown in Table 1).

TABLE 1

Relationship Between Applied Voltage and Pore Size of Nanotube Arrays

| Voltage "V" | Pore size of $TiO_2$ nanotube arrays (inner diameter) "nm" |
|---|---|
| 10 | 25-30 |
| 20 | 50-60 |
| 40 | 70-80 |
| 60 | 100-120 |

Figure 5A:
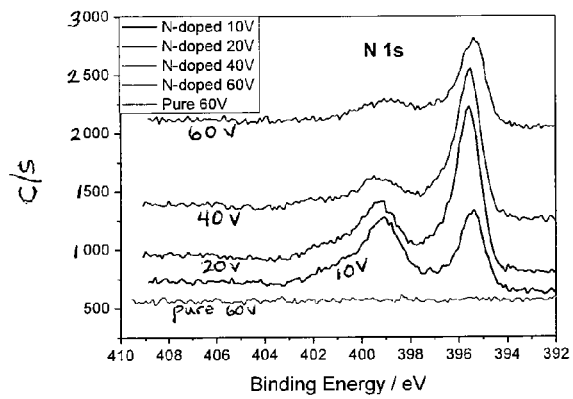
FIGS. 5(a)-5(b) show x-ray photoelectron spectroscopy (XPS) of the nitrogen is and titanium 2p region of exemplary N-doped $TiO_2$ nanotube arrays prepared at different voltages.
Figure 5B:
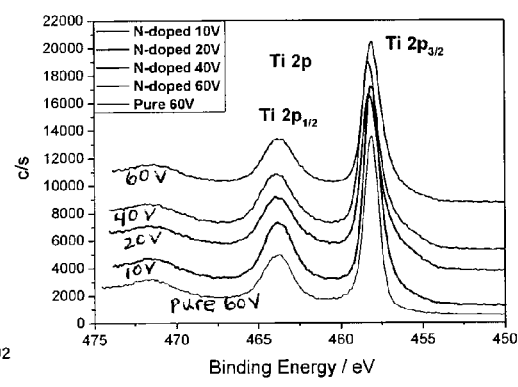

FIGS. 5(a)-5(b) show x-ray photoelectron spectroscopy (XPS) of the nitrogen 1s and titanium 2p region of exemplary N-doped $TiO_2$ nanotube arrays prepared at different voltages. The XPS data show that the size of the nanotube arrays can impact the chemical environment of the nitrogen and titanium. Based on the nitrogen 1s spectra, it can be seen that as the inner diameter of the tubes increases, more nitrogen enters substitutional lattice sites (near 395.5 eV) rather than interstitial sites (near 399 eV). The quantitative amounts of substitutional nitrogen present are: 10V: N/Ti: 0.12; 20V: N/Ti: 0.23; 40V: N/Ti: 0.22; 60V: N/Ti: 0.17.

Figure 6A:
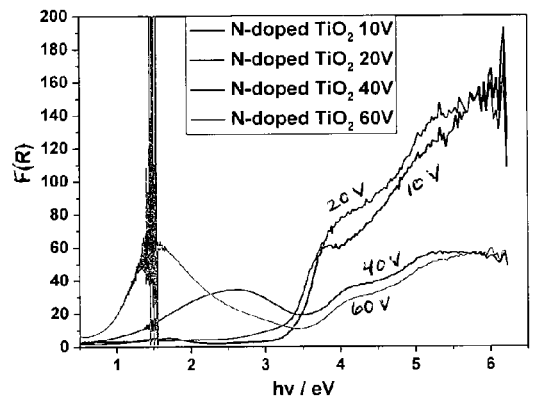
FIGS. 6(a)-6(b) show UV-vis-NIR absorption data for N-doped $TiO_2$ nanotube arrays.
Figure 6B:
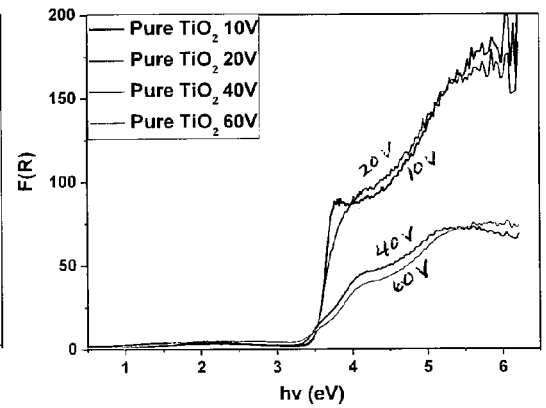

FIGS. 6(a)-6(b) provide UV-vis-NIR absorption data for N-doped $TiO_2$ nanotube arrays. Both N-doped $TiO_2$ nanotube arrays (40 V and 60 V) showed significant absorption in the visible light region.

Individual $TiO_2$ nanotubes were characterized using transmission electron microscopy (TEM) and electron energy loss spectroscopy (EELS). FIGS. 7(a)-7(b) and FIGS. 8(a)-8(b) show TEM images and corresponding EELS spectra for an exemplary N-doped $TiO_2$ nanotube. The EELS data are obtained along the length of the nanotube as shown in FIG. 7(a) and along the radial direction as shown in FIG. 8(a). The data reveal that the inner surface of the nanotube contains a larger amount of nitrogen (3-5%) compared to the outer surface of the tube (~1%).

Figure 10A:
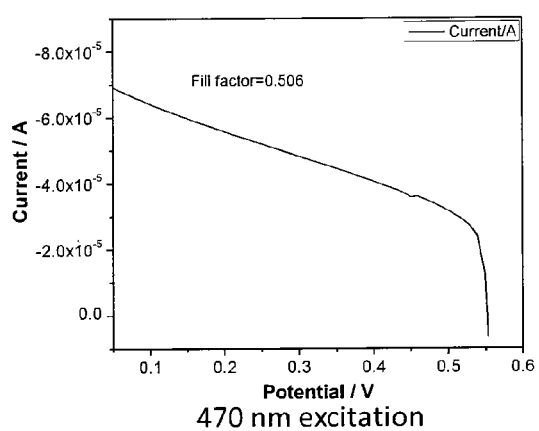
FIGS. 10(a)-10(b) show I-V characteristics and the effect of light intensity versus photocurrent of exemplary N-doped coaxial $TiO_2$ nanotube arrays under 470 nm irradiation.
Figure 10B:
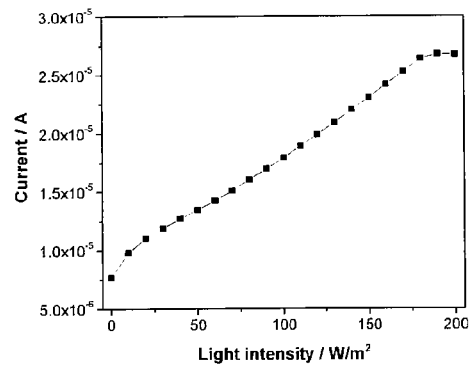

Photoelectrochemical properties of the $TiO_2$ nanotube arrays were also evaluated using the standard 3-electrode electrochemical cell. FIGS. 9(a)-9(d) show photocurrent data obtained from exemplary N-doped coaxial $TiO_2$ nanotube arrays under visible light irradiation, and FIGS. 10(a)-10(b) show I-V characteristics and the effect of light intensity versus photocurrent of exemplary N-doped coaxial $TiO_2$ nanotube arrays under 470 nm irradiation. Typically, undoped $TiO_2$ will provide photocurrent response using ultraviolet light (<400 nm). The fact that N-doped $TiO_2$ responds to visible light is providing direct evidence that N-doped $TiO_2$ has a smaller bandgap compared to undoped $TiO_2$. 625 nm absorption corresponds to a bandgap close to 2.0 eV (bandgap energy, $E_g$=1240/625 nm=1.98 eV).

Figure 11:
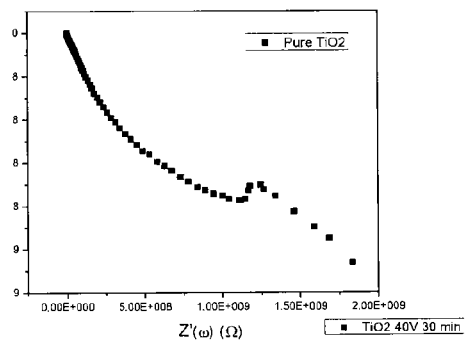
FIG. 11 shows electrochemical impedance spectra for pure and N-doped $TiO_2$ nanotube arrays.
Figure 11:
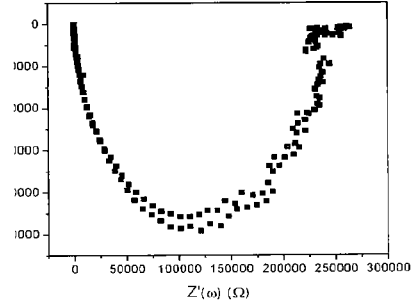
Figure 11:
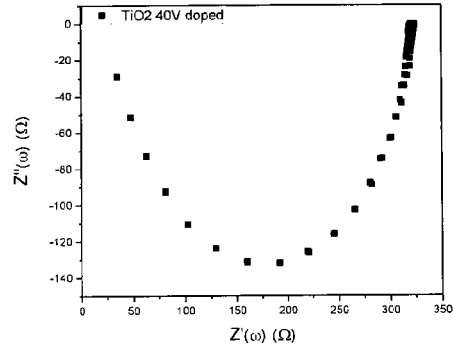

FIG. 11 provides electrochemical impedance spectra for pure and N-doped $TiO_2$ nanotube arrays. The impedance results illustrate that the N-doped nanotubes are much more conductive than pure (undoped) $TiO_2$ nanotubes, and the conductivity of the doped $TiO_2$ nanotubes seems to be related to the amount of dopant present (i.e., nitrogen levels).

Figure 12:
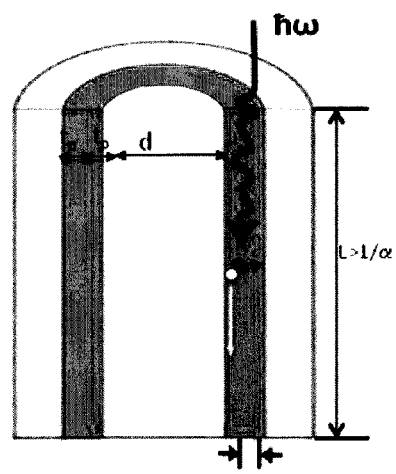
FIG. 12 illustrates results of a theoretical calculation of preferred N-doping sites in $TiO_2$.
Figure 12:
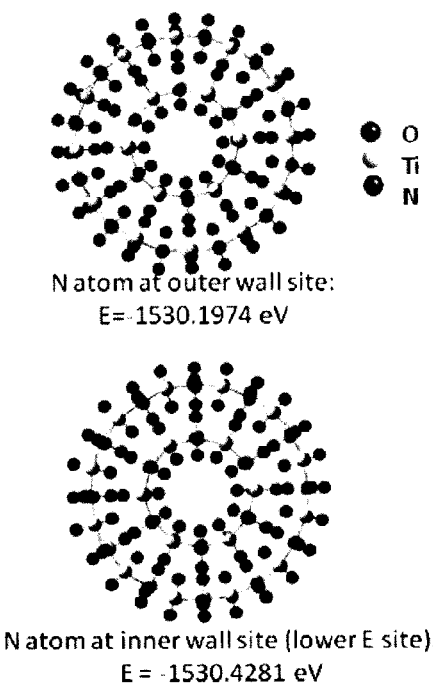

Finally, a theoretical analysis (using Molecular Dynamics (MD) simulations) of the preferred N-doping sites (inner vs. outer structures) in $TiO_2$ was carried out. FIG. 12 illustrates results of the calculation of preferred N-doping sites in $TiO_2$.

Although the present invention has been described in considerable detail with reference to certain embodiments thereof, other embodiments are possible without departing from the present invention. The spirit and scope of the appended claims should not be limited, therefore, to the description of the preferred embodiments included here. All embodiments that come within the meaning of the claims, either literally or by equivalence are intended to be embraced therein. Furthermore, the advantages described above are not necessarily the only advantages of the invention, and it is not necessarily expected that all of the described advantages will be achieved with every embodiment of the invention.

The invention claimed is:

1. A titanium dioxide nanostructure for solar energy utilization, the nanostructure comprising:
   a nanotube comprising an outer layer coaxial with an inner layer, the inner layer comprising p-type titanium dioxide and the outer layer comprising n-type titanium dioxide, an interface between the inner layer and the outer layer defining a p-n junction.

2. The nanostructure of claim 1, wherein the inner layer comprises a thickness of between about 5 nm and 40 nm.

3. The nanostructure of claim 1, wherein the inner layer comprises titanium dioxide doped with nitrogen.

4. The nanostructure of claim 3, wherein the nitrogen is present in an amount that varies along a radial direction.

5. The nanostructure of claim 4, wherein the amount of nitrogen decreases in the radial direction away from a center of the nanotube.

6. The nanostructure of claim 3, wherein the nitrogen is present in an amount that is substantially uniform along a radial direction.

7. The nanostructure of claim 3, wherein the nitrogen is present in both substitutional and interstitial sites of the titanium dioxide.

8. The nanostructure of claim 7, wherein a majority of the nitrogen is present in the substitutional sites.

9. The nanostructure of claim 1, wherein the outer layer comprises substantially undoped titanium dioxide.

10. The nanostructure of claim 9, wherein the outer layer comprises a thickness of between about 5 nm and 40 nm.

11. The nanostructure of claim 1, wherein the nanotube has an inner diameter of between about 10 nm and 80 nm.

12. An array of titanium dioxide nanostructures for solar energy utilization, the array comprising:
   a plurality of nanotubes, each nanotube comprising an outer layer coaxial with an inner layer, the inner layer comprising p-type titanium dioxide and the outer layer comprising n-type titanium dioxide, an interface between the inner layer and the outer layer defining a p-n junction.

13. The array of claim 12, wherein the plurality of nanotube structures exhibit a light absorption of visible light by shifting from 400 nm to 625 nm.

14. A method of making an array of titanium dioxide nanostructures for solar energy utilization, the method comprising:
   creating an array of nanotubes comprising titanium dioxide;
   exposing the array of nanotubes to a gas comprising a dopant element; and
   controllably doping each of the nanotubes to form an inner layer comprising p-type titanium dioxide and an outer layer coaxial with the inner layer that comprises n-type titanium dioxide, where an interface between the inner layer and the outer layer defines a p-n junction.

15. The method of claim 14, wherein creating the array of titanium dioxide nanotubes comprises anodizing a titanium foil.

16. The method of claim 15, wherein the anodizing is carried out at a voltage between 10 V and 100 V.

17. The method of claim 16, wherein the voltage is between about 40 V and 60 V.

18. The method of claim 14, wherein the anodizing is carried out at an anodizing temperature of between about −20° C. and about 20° C.

19. The method of claim 14, wherein the dopant element is nitrogen.

20. The method of claim 14, wherein exposing the array to the gas comprises flowing the gas through the array at a flow rate of between about 2 milliliters/hour and 10 liters/hour.

21. The method of claim 14, further comprising heating the array at an annealing temperature of between about 100° C. and 700° C. during the exposure to the gas.

22. The method of claim 21, wherein the annealing temperature is at least about 500° C.

23. The method of claim 14, wherein the gas is $NH_3$.

* * * * *